United States Patent
Yang et al.

(10) Patent No.: US 8,802,558 B2
(45) Date of Patent: Aug. 12, 2014

(54) COPPER INTERCONNECT STRUCTURES AND METHODS OF MAKING SAME

(71) Applicant: International Business Machines Corporation, Armonk, NY (US)

(72) Inventors: Chih-Chao Yang, Glenmont, NY (US); Marc A. Bergendahl, Albany, NY (US); David V. Horak, Essex Junction, VT (US); Baozhen Li, South Burlington, VT (US); Shom Ponoth, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 24 days.

(21) Appl. No.: 13/670,711

(22) Filed: Nov. 7, 2012

(65) Prior Publication Data

US 2014/0124933 A1    May 8, 2014

(51) Int. Cl.
- *H01L 21/4763* (2006.01)
- *H01L 23/48* (2006.01)
- *H01L 23/485* (2006.01)
- *H01L 23/482* (2006.01)
- *H01L 23/522* (2006.01)
- *H01L 23/532* (2006.01)

(52) U.S. Cl.
CPC ............ *H01L 23/481* (2013.01); *H01L 23/485* (2013.01); *H01L 23/4821* (2013.01); *H01L 23/4822* (2013.01); *H01L 23/4824* (2013.01); *H01L 23/4825* (2013.01); *H01L 23/522* (2013.01); *H01L 23/53228* (2013.01)
USPC .......................... 438/618; 438/622; 438/627

(58) Field of Classification Search
CPC . H01L 23/481; H01L 23/485; H01L 23/4821; H01L 23/4822; H01L 23/4824; H01L 23/4825; H01L 23/522; H01L 23/53228
USPC ......................................... 438/618, 622, 627
See application file for complete search history.

(56) References Cited

U.S. PATENT DOCUMENTS

| | | | |
|---|---|---|---|
| 5,439,731 A | 8/1995 | Li et al. | |
| 5,585,674 A | 12/1996 | Geffken et al. | |
| 5,989,623 A * | 11/1999 | Chen et al. | 427/96.8 |
| 6,202,191 B1 | 3/2001 | Filippi et al. | |
| 6,214,731 B1 * | 4/2001 | Nogami et al. | 438/687 |
| 6,358,832 B1 | 3/2002 | Edelstein et al. | |
| 7,033,924 B2 | 4/2006 | Ogawa et al. | |
| 7,375,026 B2 | 5/2008 | Rhodes | |
| 7,576,350 B2 | 8/2009 | Lowrey et al. | |
| 7,666,781 B2 * | 2/2010 | Hsu et al. | 438/625 |
| 2007/0059502 A1 | 3/2007 | Wang et al. | |

* cited by examiner

*Primary Examiner* — Stephen W Smoot
*Assistant Examiner* — Vicki B Booker
(74) *Attorney, Agent, or Firm* — Schmeiser, Olsen & Watts; Catherine Ivers

(57) ABSTRACT

A structure and method of making the structure. The structure includes a dielectric layer on a substrate; a first wire formed in a first trench in the dielectric layer, a first liner on sidewalls and a bottom of the first trench and a first copper layer filling all remaining space in the first trench; a second wire formed in a second trench in the dielectric layer, a second liner on sidewalls and a bottom of the second trench and a second copper layer filling all remaining space in the second trench; and an electromigration stop formed in a third trench in the dielectric layer, a third liner on sidewalls and a bottom of the third trench and a third copper layer filling all remaining space in the third trench, the electromigration stop between and abutting respective ends of the first and second wires.

15 Claims, 8 Drawing Sheets

COPPER INTERCONNECT STRUCTURES AND METHODS OF MAKING SAME

TECHNICAL FIELD

The present invention relates to the field of integrated circuit technology; more specifically, it relates to copper interconnect structures and methods of making copper interconnect structures.

BACKGROUND

Copper interconnects are used to interconnect semiconductor devices into circuits. However, current flow in through the interconnect can result in copper migration from the anode end to the cathode end of the interconnect which depletes copper at the anode end of the interconnect resulting in an increase in resistance which will cause the circuit to fail. Accordingly, there exists a need in the art to eliminate the deficiencies and limitations described hereinabove.

BRIEF SUMMARY

A first aspect of the present invention is a structure, comprising: a dielectric layer on a substrate; a first wire formed in a first trench in the dielectric layer, a first liner on sidewalls and a bottom of the first trench and a first copper layer filling all remaining space in the first trench; a second wire formed in a second trench in the dielectric layer, a second liner on sidewalls and a bottom of the second trench and a second copper layer filling all remaining space in the second trench; and an electromigration stop formed in a third trench in the dielectric layer, a third liner on sidewalls and a bottom of the third trench and a third copper layer filling all remaining space in the third trench, the electromigration stop between and abutting respective ends of the first wire and the second wire.

A second aspect of the present invention is a method, comprising: forming a dielectric layer on a substrate; simultaneously forming a first trench and a second trench in the dielectric layer; simultaneously forming a first liner on sidewalls and a bottom of the first trench and a second liner on sidewalls and a bottom of the second trench; simultaneously filling all remaining space in the first trench with a first copper layer to form a first wire in the dielectric layer and filling all remaining space in the second trench with a second copper layer to form a second wire in the dielectric layer; forming a third trench in the dielectric layer; forming a third liner on sidewalls and a bottom of the third trench; and filling all remaining space in the third trench with a third copper layer to form an electromigration stop in the dielectric layer, the electromigration stop between and abutting respective ends of the first wire and the second wire.

These and other aspects of the invention are described below.

BRIEF DESCRIPTION OF THE DRAWINGS

The features of the invention are set forth in the appended claims. The invention itself, however, will be best understood by reference to the following detailed description of illustrative embodiments when read in conjunction with the accompanying drawings, wherein:

FIGS. 10B1 and 10B2 are alternative cross-sections through line 10B-10B of FIG. 10A.

DETAILED DESCRIPTION

Figure 1A:
FIGS. 1A, 2A, 3A, 4A, 5A, 6A, 7A, 8A, 9A, and 10A. are top views

Interconnect structures according to embodiments of the present invention are formed of at least two copper damascene wires connected by a copper damascene electromigration stop. The at least two copper damascene wires and the copper damascene electromigration stop are formed in the same interlevel dielectric layer. The at least two copper damascene wires and the copper damascene electromigration stop include respective copper cores and copper diffusion barrier liners. In a preferred embodiment, here are two copper diffusion barrier liners between the copper cores of the two or more damascene wires and the copper core of the copper damascene electromigration stop. The electromigration stops effectively limit the reservoir of copper available for electromigration. The electromigration stops are placed at the intersection of two, three or four wires or formed periodically between short wire segments to make a longer wire comprising the short wire segments and the electromigration stops. The same damascene process is used to form both the copper damascene wires and the copper damascene electromigration stops. The copper diffusion barrier liners are electrically conductive.

A damascene process is one in which wire trenches or via openings are formed in a dielectric layer, an electrical conductor of sufficient thickness to fill the trenches is formed in the trenches and on a top surface of the dielectric. A chemical-mechanical-polish (CMP) process is performed to remove excess conductor and make the surface of the conductor co-planar with the surface of the dielectric layer to form damascene wires (or damascene vias). When only a trench and a wire (or a via opening and a via) is formed the process is called single-damascene.

A via first dual-damascene process is one in which via openings are formed through the entire thickness of a dielectric layer followed by formation of trenches part of the way through the dielectric layer in any given cross-sectional view. A trench first dual-damascene process is one in which trenches are formed part way through the thickness of a dielectric layer followed by formation of vias inside the trenches the rest of the way through the dielectric layer in any given cross-sectional view. All via openings are intersected by integral wire trenches above and by a wire trench below, but not all trenches need intersect a via opening. An electrical conductor of sufficient thickness to fill the trenches and via opening is formed on a top surface of the dielectric and a CMP process is performed to make the surface of the conductor in the trench co-planar with the surface of the dielectric layer to form dual-damascene wires and dual-damascene wires having integral dual-damascene vias.

The term damascene wire is intended to include single-damascene wires and dual-damascene wires. Interconnects are comprised of damascene wires embedded in interlevel dielectric (ILD) layers. A wiring level is comprised of its ILD layer and damascene wire and there are usually multiple wiring levels stacked one upon the other and interconnected by the via or via bar portions of dual-damascene wires.

Figure 1B:
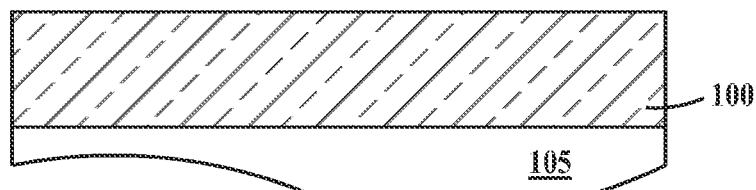
FIGS. 1B, 2B, 3B, 4B, 5B, 6B, 7B, 8B, 9B and 10B are corresponding cross-sectional views illustrating fabrication of a copper interconnect structure according to embodiments of the present invention.

FIGS. 1A, 2A, 3A, 4A, 5A, 6A, 7A, 8A, 9A, and 10A. are top views and FIGS. 1B, 2B, 3B, 4B, 5B, 6B, 7B, 8B, 9B and 10B are corresponding cross-sectional views illustrating fabrication of a copper interconnect structure according to embodiments of the present invention. FIG. 1A is a top view and FIG. 1B is a cross-section view through line 1B-1B of FIG. 1A. In FIGS. 1A and 1B an ILD layer 100 is formed on substrate 105. Dielectric layer 100 may be formed of one or more layers selected from the group consisting of silicon nitride ($Si_3N_4$), silicon carbide (SiC), and NBLok (SiC(N,H)) and low K (dielectric constant) materials having a relative permittivity of about 4 or less, examples of which include but are not limited to hydrogen silsesquioxane polymer (HSQ), methyl silsesquioxane polymer (MSQ), polyphenylene oligomer, methyl doped silica or $SiO_x(CH_3)_y$, or $SiC_xO_yH_y$ or SiOCH, organosilicate glass (SiCOH), and porous SiCOH. Other examples include porous or nonporous silicon dioxide ($SiO_2$), fluorinated $SiO_2$ (FSG), silicon nitride ($Si_3N_4$), silicon carbide (SiC), silicon oxy nitride (SiON), silicon oxy carbide (SiOC) plasma-enhanced silicon nitride ($PSiN_x$) or NBLock (SiC(N,H)).

Figure 2A:
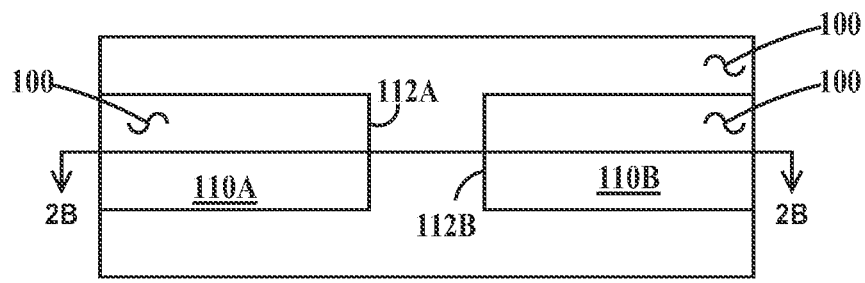
Figure 2B:
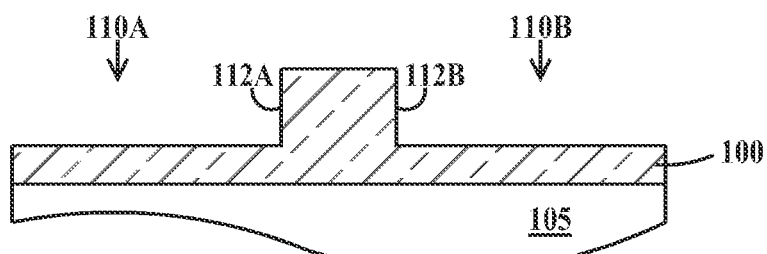

FIG. 2A is a top view and FIG. 2B is a cross-section view through line 2B-2B of FIG. 2A. In FIGS. 2A and 2B trenches 110A and 110B are etched into but not completely through ILD layer 100. A full thickness region of ILD layer 100 intervenes between ends 112A and 112B of respective trenches 110A and 110B. In one example, trenches 110A and 110B are formed using a photolithographic process to form a patterned photoresist layer, a reactive ion etch (RIE) of ILD layer 100, and subsequent removal of the patterned photoresist layer.

Figure 3A:
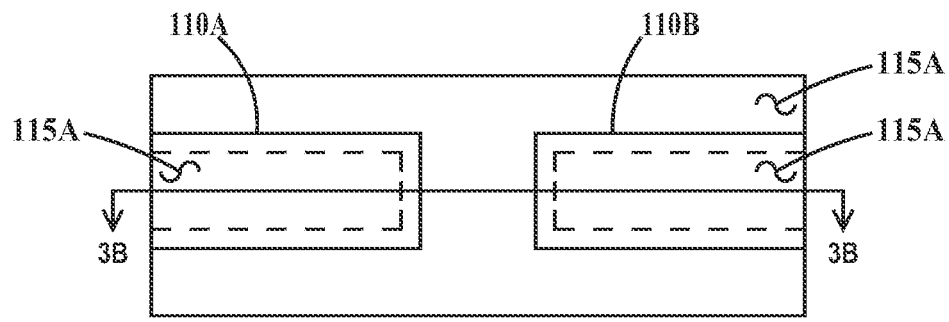
Figure 3B:
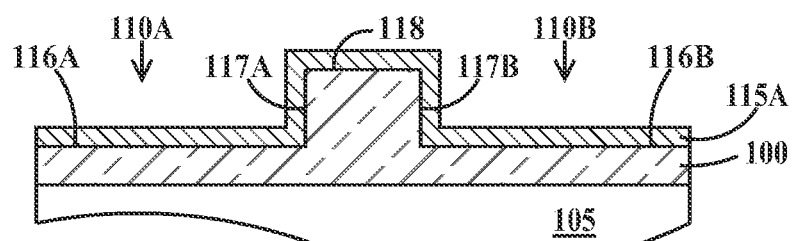

FIG. 3A is a top view and FIG. 3B is a cross-section view through line 3B-3B of FIG. 3A. In FIGS. 3A and 3B an electrically conductive layer 115A is deposited on the bottom 116A and 116B and sidewalls 117A and 117B of respective trenches 110A and 110B and also on the top surface 118 of ILD layer 100. Because layer 115A follows (i.e., conforms to) the contours of trenches 110A and 110B it is a conformal layer. In one example, layer 115A is a diffusion barrier to copper. Layer 115A may comprise one or more layers. In one example, layer 115A is comprised of a layer of tantalum TaN contacting ILD layer 100 and a layer of Ta on the TaN layer. In one example, layer 115A is comprised of a layer of titanium TiN contacting ILD layer 100 and a layer of Ti on the TiN layer. In one example, layer 115A is comprised of a layer of tungsten nitride WN contacting ILD layer 100 and a layer of W on the W layer. Other layer 115A materials include cobalt tungsten phosphide (CoWP) and cobalt silicide (CoSi). Other layer 115A materials include dual layers of cobalt silicide ($CoSi_2$)/Co, cobalt nitride (CoN)/Co, cobalt phosphide (CoP)/Co, colbalt boride (CoB)/Co, ruthenium nitride (RuN)/Ru, ruthenium phosphide ($Ru_3P_4$)/Ru and ruthenium boride (RuB)/Ru.

Figure 4A:
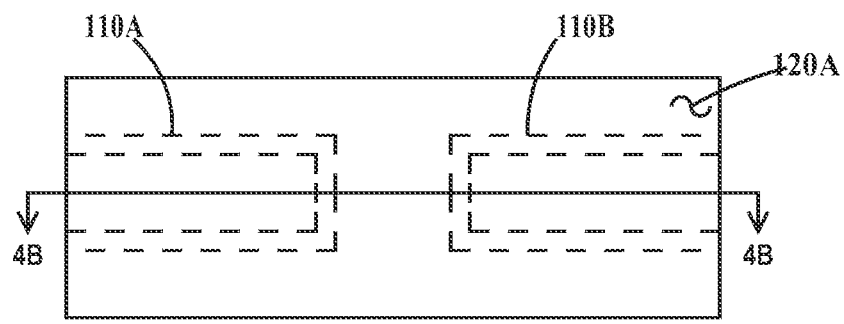
Figure 4B:
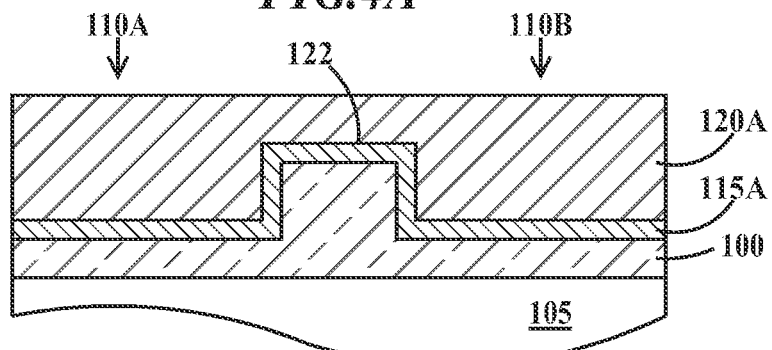

FIG. 4A is a top view and FIG. 4B is a cross-section view through line 4B-4B of FIG. 4A. In FIGS. 4A and 4B an electrically conductive copper layer 120A is formed on the top surface 122 of layer 115A. In one example, copper layer 120A is formed by depositing (e.g., evaporating or sputtering) a thin seed copper layer on layer 115A followed by electroplating a copper layer on the seed layer of sufficient thickness to overfill trenches 110A and 110B.

Figure 5A:
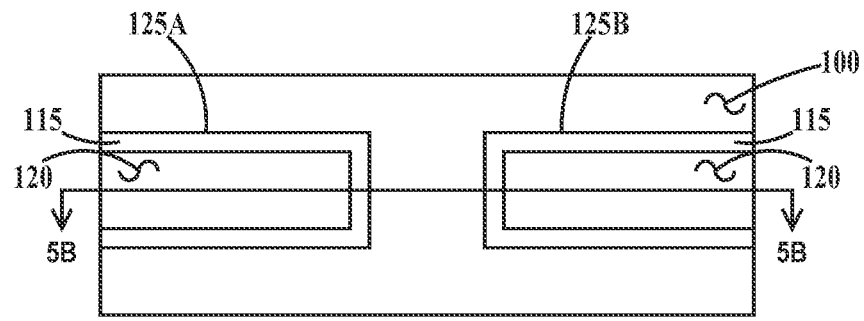
Figure 5B:
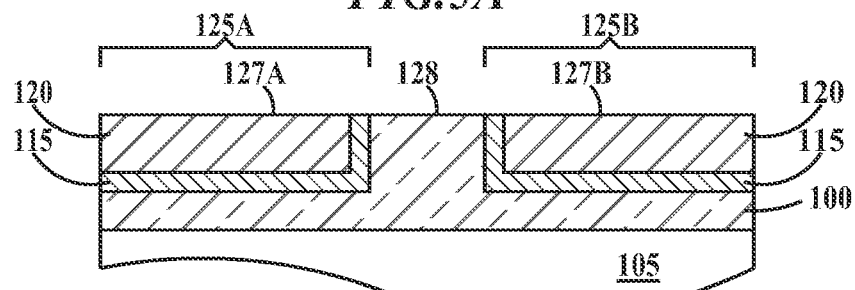

FIG. 5A is a top view and FIG. 5B is a cross-section view through line 5B-5B of FIG. 5A. In FIGS. 5A and 5B a CMP is performed to form damascene wires 125A and 125B each comprising a liner 115 and a copper core 120 and having respective top surface 127A and 127B. After the CMP, respective top surfaces 127A and 127B of wires 125A and 125B are coplanar with a top surface 128 of ILD layer 100.

Figure 6A:
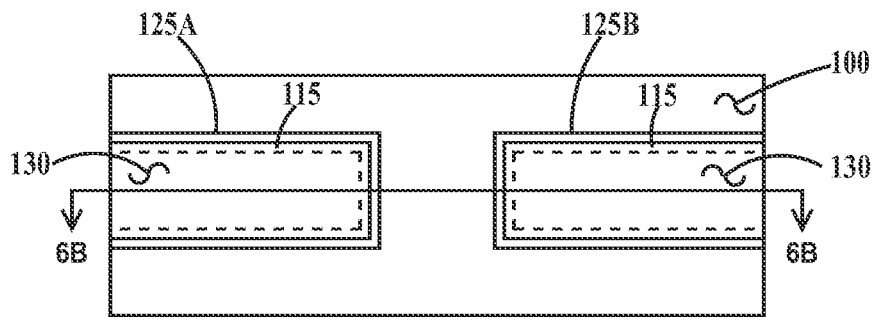
Figure 6B:
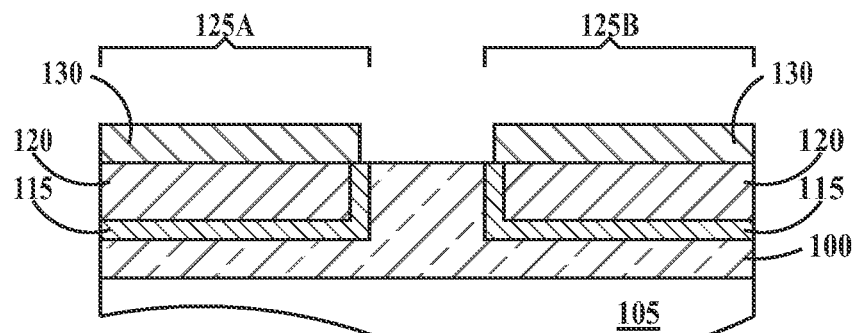

FIG. 6A is a top view and FIG. 6B is a cross-section view through line 6B-6B of FIG. 6A. In FIGS. 6A and 6B a cap layer 130 is selectively deposited on the copper cores 120 of wires 125A and 125B. While cap layer 130 may overlap liners 115 of wires 125A and 125B, it is not deposited on liners 115. Cap layer 130 is not deposited on ILD layer 100. Exemplary materials for cap layer 130 include, but are not limited to Co, Ru, W rhodium (Rh) and platinum (Pt).

Figure 7A:
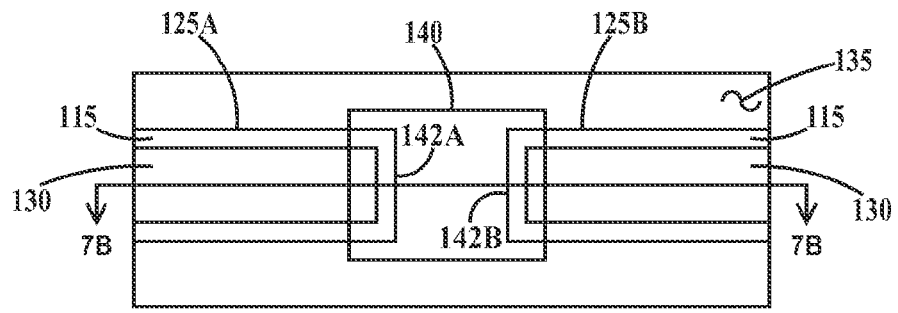
Figure 7B:
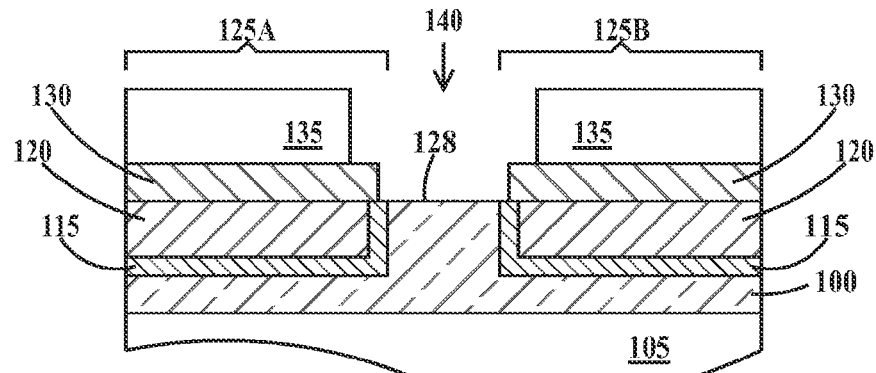

FIG. 7A is a plan view and FIG. 7B is a cross-section view through line 7B-7B of FIG. 7A. In FIGS. 7A and 7B a patterned block mask 135 is formed over capping layer 130, any exposed edges of liner 115 and top surfaces of ILD layer 100. Patterned block mask 135 has an opening 140. Opposing ends 142A and 142B of respective wires of wires 125A and 125B are exposed in opening 140. A region of top surface 128 of ILD layer 100 between ends 142A and 142B is also exposed in opening. In one example, patterned block mask is photoresist and opening 140 is formed photolithographically.

Figure 8A:
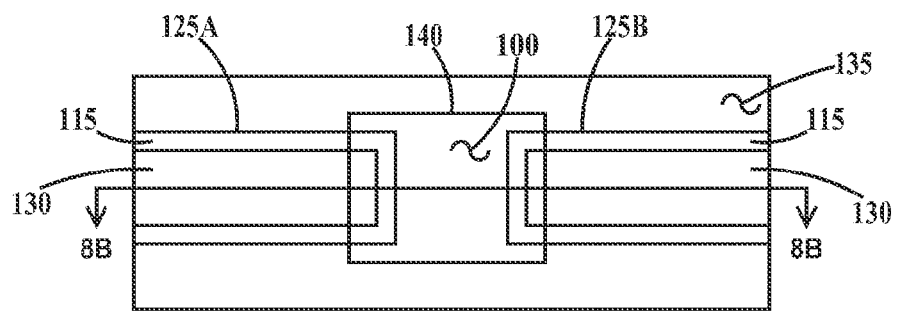
Figure 8B:
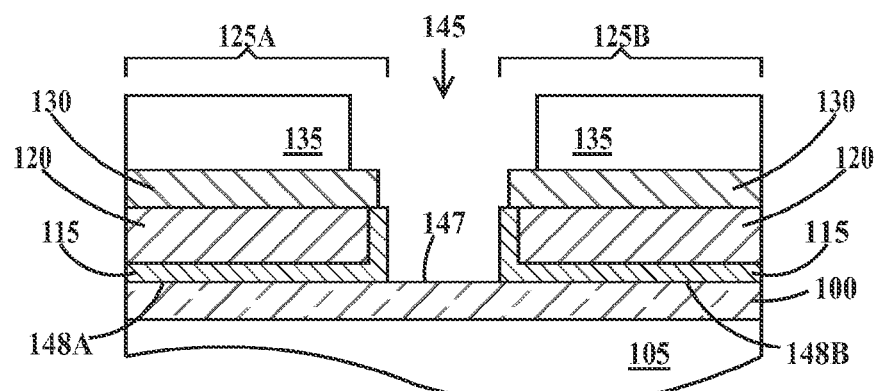

FIG. 8A is a plan view and FIG. 8B is a cross-section view through line 8B-8B of FIG. 8A. In FIGS. 8A and 8B a trench 145 is formed in ILD layer 100 where the ILD layer is not protected by block mask 135 or wires 125A and 125B. Capping layer 130 protects wires 125A and 125B during the etching process used to form trench 145. In one example, trench 145 is formed by a RIE process. In FIG. 8B, a bottom surface 147 of trench 145 is coplanar with respective bottom surfaces 148A and 148B of wires 125A and 125B. In other words, trench 145 extends into ILD layer 100 the same distance as wires 125A and 125B. Alternatively, trench 145 may extend into ILD layer 100 a lesser or greater distance as wires 125A and 125B.

Figure 9A:
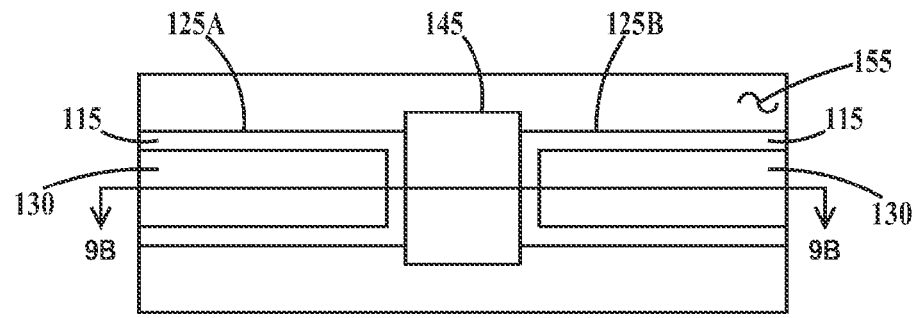
Figure 9B:
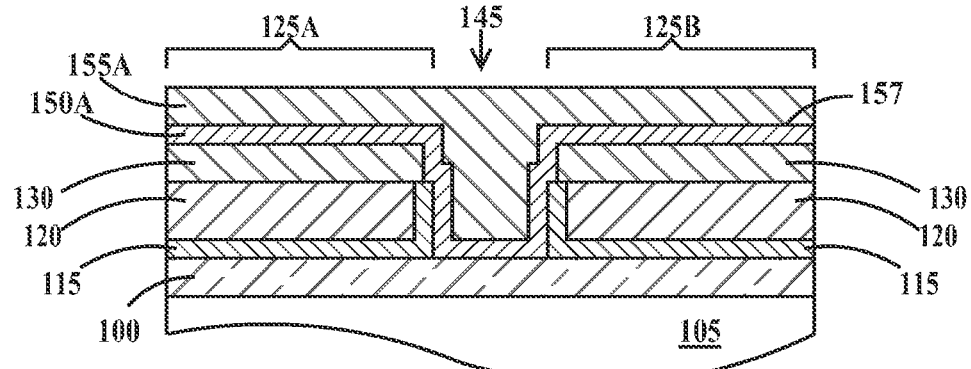

FIG. 9A is a plan view and FIG. 9B is a cross-section view through line 9B-9B of FIG. 9A. In FIGS. 9A and 9B an electrically conductive layer 150A is deposited on the exposed surfaces of capping layer 130, wires 125A and 125B and ILD layer 100. Because layer 150A follows (i.e., conforms to) the contours of trench 145 it is a conformal layer. Next, an electrically conductive copper layer 155A is formed on the top surface 157 of layer 150A. In one example, copper layer 155A is formed by depositing a thin seed copper layer on layer 150A followed by electroplating a copper layer on the seed layer of sufficient thickness to overfill trench 145. In one example, layer 150A is a diffusion barrier to copper. Layer 150A may comprise one or more layers. Exemplary materials for layer 150A are the same as for layer 115A described supra.

Figure 10A:
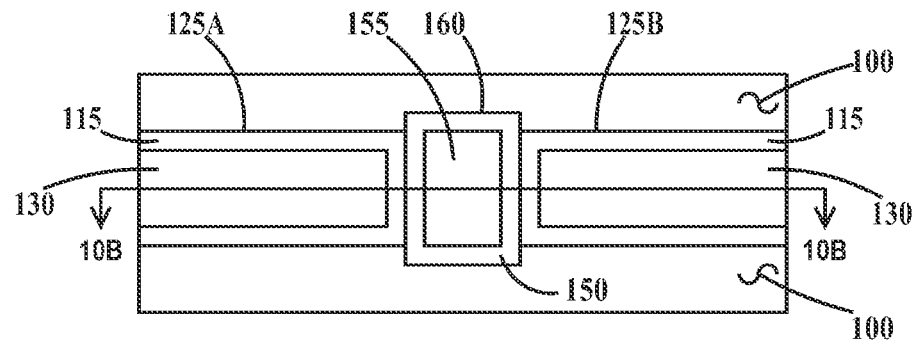
Figure 10B:
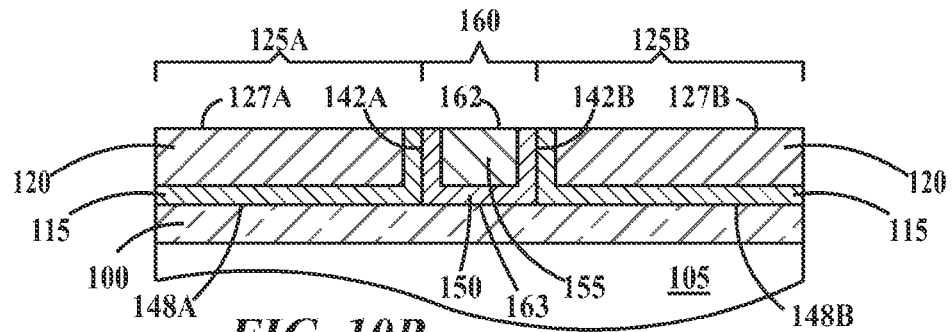

FIG. 10A is a top view and FIG. 10B is a cross-section view through line 10B-10B of FIG. 10A. In FIGS. 10A and 10B a CMP is performed to form electromigration stop 160 comprising a liner 150 and a copper core 155 and having a top surface 162. After the CMP, top surface 162 of electromigration stop 160 is coplanar with respective top surfaces 127A and 127B of wires 125A and 125B (as well as the top surface of ILD layer 100). Electromigration stop 160 is in direct physical and electrical contact with ends 142A and 142B of respective wires 125A and 125B. Electromigration stop 160 stops copper migration from wire 125A to wire 125B and from wire 125B to wire 125A. In FIG. 10B, a bottom surface 163 of electromigration stop 160 is coplanar with respective bottom surfaces 148A and 148B of wires 125A and 125B. In other words, electromigration stop 160 extends into ILD layer 100 the same distance as wires 125A and 125B. Alternatively, electromigration stop 160 may extend into ILD layer 100 a lesser or greater distance than wires 125A and 125B extend into ILD layer 100 as illustrated in FIGS. 10B1 and 10B2.

FIGS. 10B1 and 10B2 are alternative cross-sections through line 10B-10B of FIG. 10A. In FIG. 10B1, bottom surface 163 of electromigration stop 160 extends into ILD layer 100 a lesser distance than wires 125A and 125B extend into ILD layer 100. In FIG. 10B2, bottom surface 163 of electromigration stop 160 extends into ILD layer 100 a greater distance than wires 125A and 125B extend into ILD layer 100.

Figure 11A:
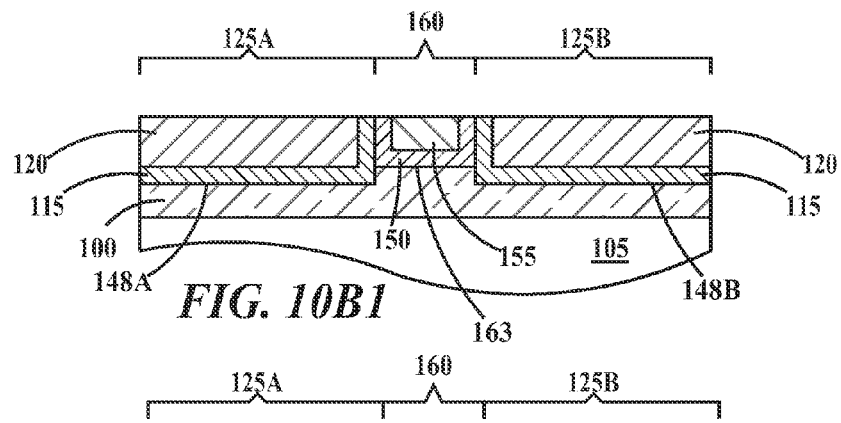
FIGS. 11A, 11B, 12, 13A, 13B, 14, 15A, 15B and 16 illustrate exemplary copper interconnect structure layouts according to embodiments of the present invention.
Figure 11A:
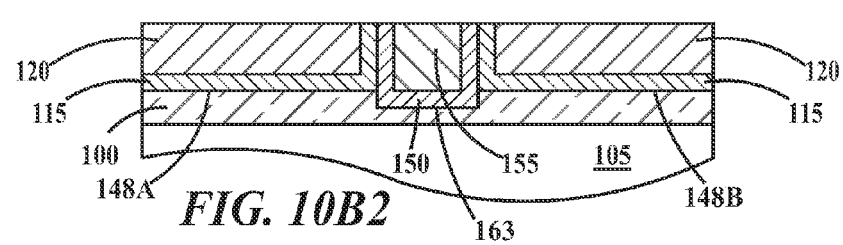
Figure 11A:
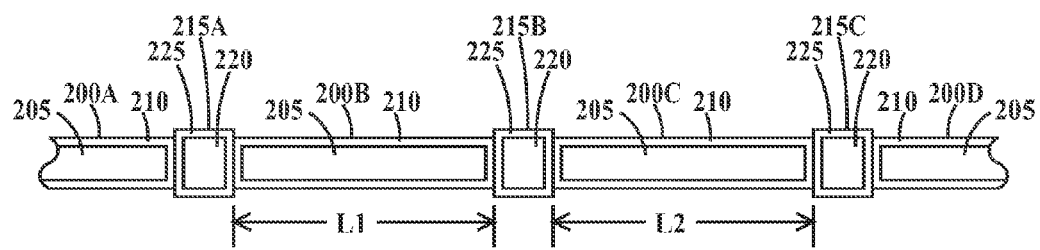
Figure 11B:
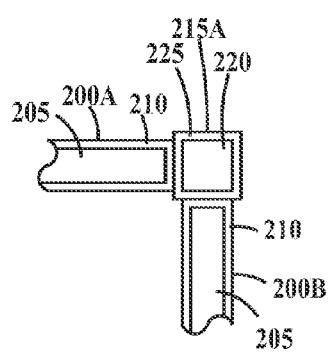

FIGS. 11A and 11B illustrate exemplary copper interconnect structure layouts according to embodiments of the present invention. In FIG. 11A, a series of wires 200A, 200B, 200C and 200D (comprised of copper cores 205 and copper diffusion barrier liners 210) are interconnected electrically and physically by electromigration stops 215A, 215B and 215C (comprised of copper cores 220 and copper diffusion barrier liners 225). The materials of liners 210 and 225 may be the same or different. Wire 200B has a length L1 measured between electromigration stops 215A and 125B and wire 200C has a length L2 measured between electromigration stops 215B and 125C. In one example, L1 and L2 are less than the Blech length. A wire having a length below the Blech length will not fail by electromigration because mechanical stress buildup causes an atom back flow which reduces or compensates for the electromigration atom flow towards the anode. FIG. 11B illustrates that electromigration stops can be used in place of a corner region of a single contiguous wire. In one example, copper diffusion barrier liners 210 and 225 are electrically conductive. Liners 210 and 225 may comprise one or more layers. Exemplary materials for liners 210 and 225 are the same as for layer 115A described supra.

Figure 12:
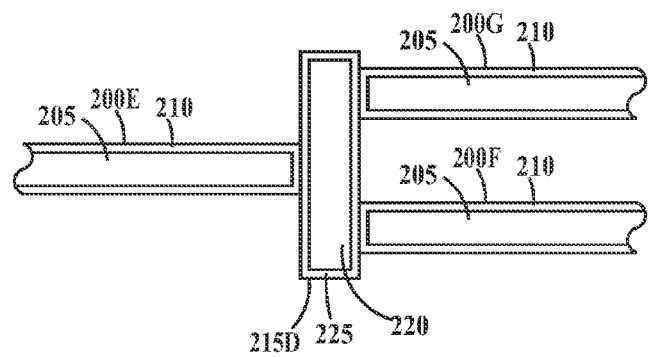

FIG. 12 illustrates an exemplary copper interconnect structure layout according to embodiments of the present invention. In FIG. 12, three wires 200E, 200F and 200G (comprised of copper cores 205 and copper diffusion barrier liners 210) are interconnected electrically and physically by an electromigration stop 215D (comprised of copper core 220 and copper diffusion barrier liner 225). Wire 200E is on the opposite side of electromigration stop 215D from wires 200F and 200G. The materials of liners 210 and 225 may be the same or different. The number of wires (three) should be considered exemplary and there can be few as three wires or more than three wires as long as there is at least one wire on a first side of the electromigration stop and are least two wires on a different side (in one example on an opposite side) of the electromigration stop.

Figure 13A:
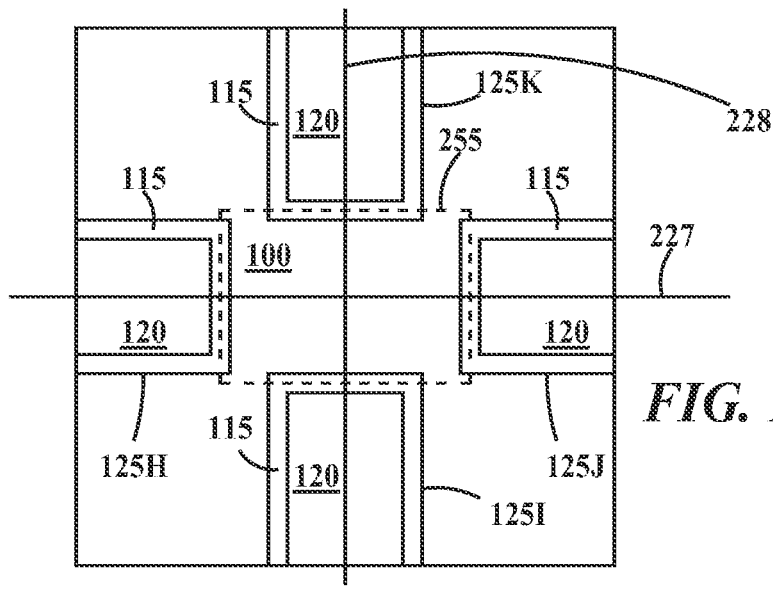
Figure 13B:
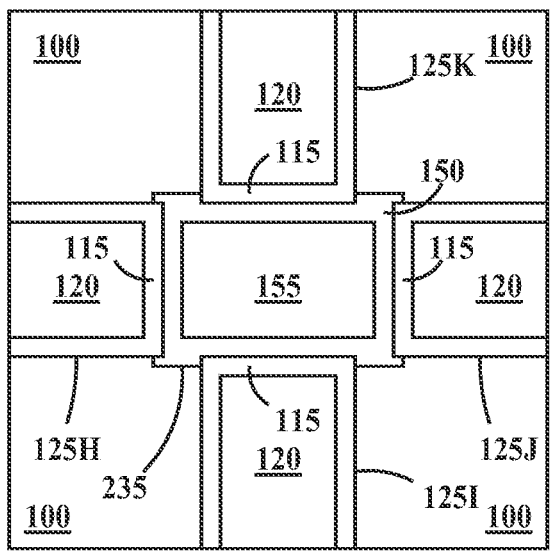

FIGS. 13A and 13B illustrate an exemplary copper interconnect structure layout according to embodiments of the present invention. FIG. 13A illustrates four mutually orthogonal wires 125H, 125I, 125J and 125K that are to be interconnected by an electromigration stop. Dashed line 255 indicates the opening in the patterned photoresist layer that defines the topological extents of the electromigration stop (see, for example, FIG. 7A) of FIG. 13B (and also FIG. 14). In FIG. 13B, the four wires 125H, 125I, 125J and 125K (comprised of copper cores 120 and copper diffusion barrier liners 115) are interconnected by electromigration stop 235 (comprised of copper core 155 and copper diffusion barrier liner 150). Liner 115 and 150 may be the same or different. Wires 125H and 125J have a common first longitudinal axis 227 and wires 125I and 125K have a common second longitudinal axis 228. First axis 227 is perpendicular to second axis 228. Electromigration stop 235 is thus formed at the cardinal intersection of the axes of wires 125H, 125I, 125J and 125K.

Figure 14:
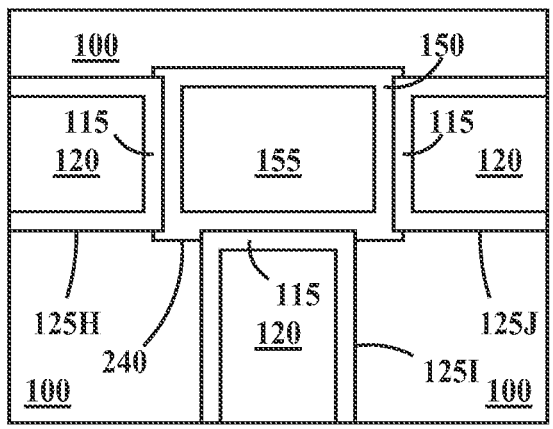

FIG. 14 is similar to FIG. 13B except only three wires 125H, 125I and 125J are interconnected by an electromigration stop 240 (comprised of copper core 155 and copper diffusion barrier liner 150).

Figure 15A:
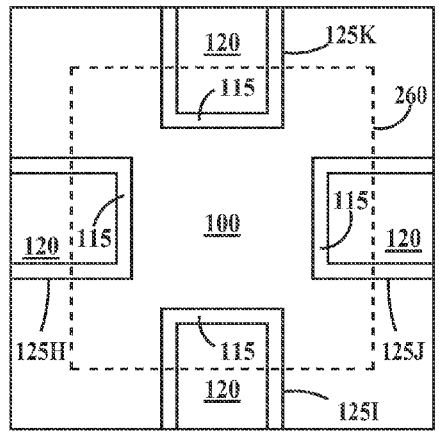
Figure 15B:
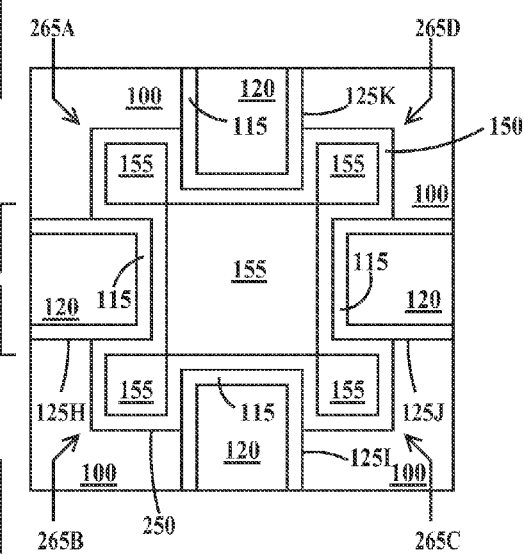

FIGS. 15A and 15B illustrate an exemplary copper interconnect structure layout according to embodiments of the present invention. FIG. 15A illustrates the same four mutually orthogonal wires 125H, 125I, 125J and 125K of FIG. 13A that are to be interconnected by an electromigration stop except that they are spaced further apart. Dashed line 260 indicates the opening in the patterned photoresist layer that defines the topological extents of the electromigration stop (see, for example, FIG. 7A) of FIG. 15B. In FIG. 15B, the four wires 125H, 125I, 125J and 125K (comprised of copper cores 120 and copper diffusion barrier liners 115) are interconnected by electromigration stop 250. Electromigration stop 250 is thus formed at the cardinal intersection of the axes of wires 125H, 125I, 125J and 125K. Electromigration stop 250 differs from electromigration stop 235 of FIG. 13 in that electromigration stop 250 includes a body 255 (comprised of copper core 150 and copper diffusion barrier liner 155) and corner projections 265A, 265B, 265C and 265D comprised of copper cores 150 and copper diffusion barrier liners 155. The liners (115) of corner projections 265A, 265B, 265C and 265D are simultaneously formed with and contiguous with the liner (115) of electromigration stop 250, but the copper cores (120) of corner projections 265A, 265B, 265C and 265D though simultaneously formed with the copper core (120) of electromigration stop 250 are not contiguous with the copper core (120) of electromigration stop 250. Also, only the three wires 125H, 125I and 125J may be formed as in FIG. 14 in which case corner regions 265A and 265D would merge.

Figure 16:
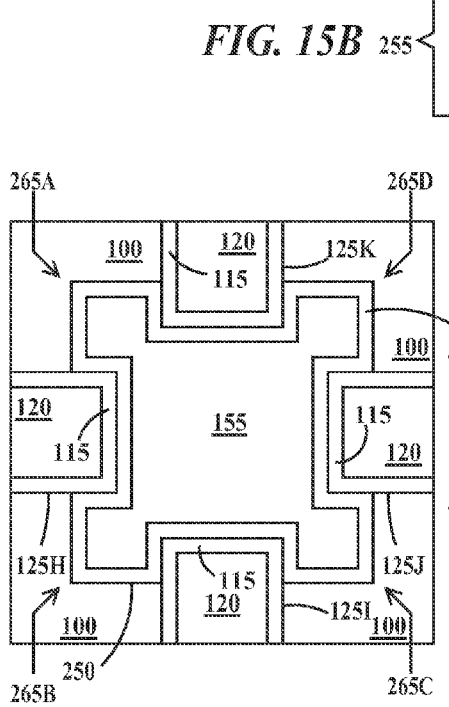

FIG. 16 is similar to FIG. 15 except the copper cores (120) of corner projections 265A, 265B, 265C and 265D are contiguous with the copper core (120) of body 255.

Thus, the embodiments of the present invention provide copper interconnect structures that are resistant to and can prevent electromigration fails dependent upon the geometry of the interconnect structures.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:
1. A method, comprising:
 forming a dielectric layer on a substrate;
 simultaneously forming a first trench and a second trench in said dielectric layer;
 simultaneously forming a first liner on sidewalls and a bottom of said first trench and a second liner on sidewalls an a bottom of said second trench;
 simultaneously filling all remaining space in said first trench with a first copper layer to form a first wire in said dielectric layer and filling all remaining space in said second trench with a second copper layer to form a second wire in said dielectric layer;
 forming a third trench in said dielectric layer;
 forming a third liner on sidewalls and a bottom of said third trench; and
 filling all remaining space in said third trench with a third copper layer to form an electromigration stop in said dielectric layer, said electromigration stop between and abutting respective ends of said first wire and said second wire.

2. The method of claim 1, wherein regions of said first liner on a sidewall of said first trench abut a region of said third liner on a first sidewall of said third trench and regions of said second liner on a sidewall of said second trench abut a region of said third liner on a second and opposite sidewall of said third trench.

3. The method of claim 1, wherein regions of said first liner on a sidewall of said first trench abut a region of said third liner on a first sidewall of said third trench and regions of said second liner on a sidewall of said second trench abut a region of said third liner on a second and adjacent sidewall of said third trench.

4. The method of claim 1, wherein a first region of said first wire abutting said electromigration etch stop and a second region of said second wire abutting said electromigration stop extend from a top surface of said dielectric layer into said dielectric layer a first distance and said electromigration stop extends from said top surface of said dielectric layer into said dielectric layer a second distance, said first distance greater than said second distance.

5. The method of claim 1, wherein a first region of said first wire abutting said electromigration etch stop and a second region of said second wire abutting said electromigration stop extend from a top surface of said dielectric layer into said dielectric layer a first distance and said electromigration stop extends from said top surface of said dielectric layer into said dielectric layer a second distance, said second distance greater than said first distance.

6. The method of claim 1, further including:
simultaneously with forming said first and second trenches, forming a fourth trench in said dielectric layer;
simultaneously with forming said first and second liners, forming an electrically conductive fourth liner on sidewalls and a bottom of said fourth trench;
simultaneously with filling said remaining space in said first and second trenches, filling all remaining space in said fourth trench with a fourth copper layer to form a third wire in said dielectric layer;
wherein said a first wire abuts said electromigration stop on a first side of said electromigration stop and said second wire and third wire abut said electromigration stop on a second side of said electromigration stop;
wherein said first liner, said second liner, said third liner and said fourth liner are copper diffusion barrier; and
wherein top surfaces of said first wire, said second wire, said third wire, said electromigration stop and said dielectric layer are coplanar.

7. The method of claim 1, further including:
simultaneously with forming said first and second trenches, forming a fourth trench in said dielectric layer;
simultaneously with forming said first and second liners, forming an electrically conductive fourth liner on sidewalls and a bottom of said fourth trench;
simultaneously with filling said remaining space in said first and second trenches, filling all remaining space in said fourth trench with a fourth copper layer to form a third wire in said dielectric layer;
wherein said a first wire abuts said electromigration stop on a first side of said electromigration stop, said a second wire abuts said electromigration stop on a second side of said electromigration stop, and said a third wire abuts said electromigration stop on a third side of said electromigration stop;
wherein said first liner, said second liner, said third liner and said fourth liner are copper diffusion barriers; and
wherein top surfaces of said first wire, said second wire, said third wire, said electromigration stop and said dielectric layer are coplanar.

8. The method of claim 1, further including:
simultaneously with forming said first and second trenches, forming a fourth trench and a fifth trench in said dielectric layer;
simultaneously with forming said first and second liners, forming an electrically conductive fourth liner on sidewalls and a bottom of said fourth trench and an electrically conductive fifth liner on sidewalls and a bottom of said fifth trench;
simultaneously with filling said remaining space in said first and second trenches, filling all remaining space in said fourth trench with a fourth copper layer to form a third wire and filling all remaining space in said fifth trench with a fifth copper layer to form a fourth wire;
wherein said first wire abuts said electromigration stop on first side of said electromigration stop, said second wire abuts said electromigration stop on second side of said electromigration stop, said third wire abuts said electromigration stop on third side of said electromigration stop, said fourth wire abuts said electromigration stop on fourth side of said electromigration stop;
wherein said first side of said electromigration stop is opposite said second side of said electromigration stop and said third side of said electromigration stop is opposite said fourth side of said electromigration stop;
wherein said first liner, said second liner, said third liner and said fourth liner are copper diffusion barriers; and
wherein top surfaces of said first wire, said second wire, said third wire, said fourth wire, said electromigration stop and said dielectric layer are coplanar.

9. The method of claim 8, wherein said electromigration stop includes a body portion and four integral corner projections, each corner projection extending along adjacent sides of respective pairs of said first and second wires, said second and third wires said third and fourth wires and said fourth and first wires, said corner projections including a region of said third liner and said third copper layer.

10. The method of claim 1, further including:
simultaneously with forming said first and second trenches, forming a fourth trench in said dielectric layer;
simultaneously with forming said first and second liners, forming an electrically conductive fourth liner on sidewalls and a bottom of said fourth trench;
simultaneously with filling said remaining space in said first and second trenches, filling all remaining space in said fourth trench with a fourth copper layer to form a third wire in said dielectric layer;
simultaneously with forming said third trench, forming a fifth trench in said dielectric layer;
simultaneously with forming said electrically third liner, forming an electrically conductive fifth liner on sidewalls and a bottom of said fifth trench;
simultaneously with filling said all remaining space in said third trench, filling all remaining space in said fifth trench with a fifth copper layer to for an additional electromigration stop, said additional electromigration stop between and abutting respective ends of said second wire and said second wire, said end of said second wire abutting said additional electromigration stop opposite from said end of said second wire abutting said electromigration stop.

11. The method of claim 1, wherein said first liner, said second liner and said third liner are copper diffusion barriers.

12. The method of claim 1, wherein top surfaces of said first wire, said second wire, said electromigration stop and said dielectric layer are coplanar.

13. The method of claim 1, wherein a first longitudinal axes of said first wire and a second longitudinal axes of said second wire are coaxial.

14. The method of claim 8, wherein said first and second wires have a common first longitudinal axis and said third and fourth wires have a common second longitudinal axis, said first longitudinal axis perpendicular to said second longitudinal axis.

15. The method of claim 1, wherein said first, said second and said third liners comprise a tantalum nitride layer on the sidewalls and bottom of said first, second and third trenches and a tantalum layer on said tantalum nitride layer.

* * * * *